(12) United States Patent
Hayashi et al.

(10) Patent No.: US 11,629,092 B2
(45) Date of Patent: Apr. 18, 2023

(54) METHOD FOR MANUFACTURING ALKALI-FREE GLASS SUBSTRATE AND ALKALI-FREE GLASS SUBSTRATE

(71) Applicant: NIPPON ELECTRIC GLASS CO., LTD., Otsu (JP)

(72) Inventors: Masahiro Hayashi, Otsu (JP); Toru Hasegawa, Otsu (JP); Toru Sakurabayashi, Otsu (JP)

(73) Assignee: NIPPON ELECTRIC GLASS CO., LTD., Otsu (JP)

( * ) Notice: Subject to any disclaimer, the term of this patent is extended or adjusted under 35 U.S.C. 154(b) by 15 days.

(21) Appl. No.: 16/644,251

(22) PCT Filed: Aug. 30, 2018

(86) PCT No.: PCT/JP2018/032147
§ 371 (c)(1),
(2) Date: Mar. 4, 2020

(87) PCT Pub. No.: WO2019/049768
PCT Pub. Date: Mar. 14, 2019

(65) Prior Publication Data
US 2020/0199012 A1    Jun. 25, 2020

(30) Foreign Application Priority Data

Sep. 5, 2017 (JP) ............................. JP2017-170227
Oct. 10, 2017 (JP) ............................. JP2017-196722
Aug. 2, 2018 (WO) ................. PCT/JP2018/029122

(51) Int. Cl.
*C03C 3/097* (2006.01)
*C03B 5/027* (2006.01)
(Continued)

(52) U.S. Cl.
CPC ............. *C03C 3/097* (2013.01); *C03B 5/027* (2013.01); *C03B 5/225* (2013.01); *C03B 17/064* (2013.01);
(Continued)

(58) Field of Classification Search
CPC ......... C03C 3/097; C03C 3/087; C03C 3/093; C03B 5/027; C03B 5/225; C03B 17/064; H01L 27/1218; H01L 27/1262
See application file for complete search history.

(56) References Cited

U.S. PATENT DOCUMENTS 3,842,180 A * 10/1974 Froberg ............... H05B 3/0023
373/40
2014/0377525 A1* 12/2014 Kawaguchi ............. C03C 3/093
428/220
(Continued)

FOREIGN PATENT DOCUMENTS

| CN | 101808951 A | 8/2010 |
| CN | 104039727 A | 9/2014 |

(Continued)

OTHER PUBLICATIONS

WO2016185976A1 translation via EspaceNet (Year: 2016).*
(Continued)

*Primary Examiner* — Karl E Group
*Assistant Examiner* — Cameron K Miller
(74) *Attorney, Agent, or Firm* — Faegre Drinker Biddle & Reath LLP

(57) ABSTRACT

Provided is an alkali-free glass substrate having a high strain point and excellent bubble count, and a method for manufacturing the alkali-free glass substrate. The method includes: a batch preparing process of preparing a raw material batch so as to obtain alkali-free glass containing, in mass %, 50 to 80% of $SiO_2$, 15 to 30% of $Al_2O_3$, 0 to 4.5%
(Continued)

of $B_2O_3$, 0 to 10% of MgO, 0 to 15% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition; a melting process of melting the prepared raw material batch; a fining process of fining the molten glass; and a forming process of forming the fined glass into a sheet shape. The raw material batch is melted such that a bubble enlarging temperature of the obtained glass is lower than a maximum temperature of the fining process.

13 Claims, 2 Drawing Sheets

(51) Int. Cl.
　　　*C03B 5/225*　　　(2006.01)
　　　*C03B 17/06*　　　(2006.01)
　　　*C03C 3/093*　　　(2006.01)
　　　*C03C 3/087*　　　(2006.01)
　　　*H01L 27/12*　　　(2006.01)
　　　*G09F 9/30*　　　(2006.01)

(52) U.S. Cl.
　　　CPC .............. *C03C 3/087* (2013.01); *C03C 3/093* (2013.01); *H01L 27/1218* (2013.01); *H01L 27/1262* (2013.01); *G09F 9/30* (2013.01)

(56) References Cited

U.S. PATENT DOCUMENTS

| 2017/0297948 | A1* | 10/2017 | Bowden | .................... C03B 1/00 |
| 2018/0141849 | A1 | 5/2018 | Saito et al. | |

FOREIGN PATENT DOCUMENTS

| JP | 2013-151407 A | 8/2013 | |
| KR | 100990875 B1 * | 11/2010 | |
| TW | 201704173 A | 2/2017 | |
| WO | WO-2009/054314 A1 | 4/2009 | |
| WO | WO-2014/157349 A1 | 10/2014 | |
| WO | WO-2016/185976 A1 | 11/2016 | |
| WO | WO-2016185976 A1 * | 11/2016 | ............... G09F 9/30 |

OTHER PUBLICATIONS

KR100990875B1 machine translation (Year: 2010).*
The First Office Action dated Sep. 30, 2021 in Chinese Patent Application No. 201880057782.9 (10 pages) with an English translation (13 pages).
International Search Report dated Nov. 13, 2018 for PCT/JP2018/032147.
Office Action dated Aug. 11, 2021 in Taiwanese Patent Application No. 107130922.
English-language translation of PCT/ISA/237 issued in the counterpart PCT Application No. PCT/JP2018/032147 dated Nov. 13, 2018.
The Second Office Action dated Mar. 9, 2022 in Chinese Patent Application No. 201880057782.9 (6 pages) with an English translation (9 pages).
Notice of Reasons for Refusal dated May 16, 2022 in Japanese Patent Application No. 2019-540923 (3 pages) with English translation (3 pages).
Decision on Rejection dated Aug. 9, 2022 in Chinese Patent Application No. 201880057782.9 (5 pages) with English translation (9 pages).
Korean Office Action dated Dec. 21, 2022 in Korean Patent Application No. 10-2020-7006506 with English-language translation.

* cited by examiner (a)

(b)

(c)

METHOD FOR MANUFACTURING ALKALI-FREE GLASS SUBSTRATE AND ALKALI-FREE GLASS SUBSTRATE

TECHNICAL FIELD

The present invention relates to an alkali-free glass substrate, and more particularly to an alkali-free glass substrate suitable for a display or the like including a thin film transistor (TFT) which includes a low temperature polysilicon (LTPS) film.

BACKGROUND ART

In a flat panel display, a glass substrate is generally used as a support substrate. An electric circuit pattern, such as a TFT, is formed on a surface of the glass substrate. Therefore, an alkali-free glass substrate substantially free of alkali metal components is adopted for this type of glass substrate so as not to adversely affect the TFT or the like.

The glass substrate is exposed to a high temperature atmosphere in a process of forming an electric circuit pattern, such as a thin film forming process or a thin film patterning process. When the glass substrate is exposed to the high temperature atmosphere, since structural relaxation of the glass progresses, the volume of the glass substrate shrinks (hereinafter, this shrinkage of the glass is referred to as "thermal shrinkage"). When thermal shrinkage occurs in the glass substrate in the process of forming the electric circuit pattern, a shape dimension of the electric circuit pattern formed on the glass substrate deviates from a design value, thus it is difficult to obtain a flat panel display having desired electric performance. Therefore, it is desired that a glass substrate on which a thin film pattern such as an electric circuit pattern is formed, such as a glass substrate for a flat panel display, has a small thermal shrinkage rate.

Particularly, in the case of a glass substrate for a high-definition display including a TFT which includes a low-temperature polysilicon film, when the low-temperature polysilicon film is formed, for example, the glass substrate is exposed to a very high temperature atmosphere of 450° C. to 600° C., thermal shrinkage is likely to occur, and it is difficult to obtain desired electric performance when the thermal shrinkage occurs since the electric circuit pattern has high definition. Therefore, it is strongly desired that the glass substrate used for such an application has a very low thermal shrinkage rate.

Meanwhile, a float method, a downdraw method represented by an overflow downdraw method, and the like are known as methods for forming a glass substrate used in a flat panel display or the like.

The float method is a method of forming a glass substrate by making molten glass flow out onto a float bath filled with molten tin and extend in a horizontal direction to form a glass ribbon, and then annealing the glass ribbon in an annealing furnace provided downstream of the float bath. In the float method, since a conveyance direction of the glass ribbon is horizontal, it is easy to lengthen the annealing furnace. Therefore, it is easy to sufficiently lower a cooling speed of the glass ribbon in the annealing furnace. Accordingly, the float method has an advantage that a glass substrate having a small thermal shrinkage rate can be easily obtained.

However, the float method has a disadvantage that it is difficult to form a thin glass substrate, and a disadvantage that a surface of the glass substrate has to be polished after the forming to remove tin adhered to the surface of the glass substrate.

On the other hand, the downdraw method is a method in which molten glass is stretched downward to form a sheet shape. The overflow downdraw method, which is one type of the downdraw method, is a method of forming a glass ribbon by drawing molten glass overflowing from two sides of a forming body having a substantially wedge-shaped cross section downward. The molten glass overflowing from the two sides of the forming body flows down along two side surfaces of the forming body, and joins each other below the forming body. Therefore, in the overflow downdraw method, since a surface of the glass ribbon is formed by surface tension without contacting anything other than air, a glass substrate having a flat surface can be obtained with no foreign matter adhered to the surface even if the surface is not polished after forming. In addition, there is an advantage that a thin glass substrate can be easily formed according to the overflow downdraw method.

On the other hand, in the downdraw method, the molten glass flows downward from the forming body. When a long annealing furnace is placed below the forming body, the forming body has to be placed at a high place. However, in practice, there is a limit on the height at which the forming body can be placed due to limitation on the height of a ceiling of a factory or the like. That is, in the downdraw method, there is limitation on a length dimension of the annealing furnace, so it may be difficult to dispose a sufficiently long annealing furnace. When a length of the annealing furnace is short, since the cooling speed of the glass ribbon is high, it is difficult to form a glass substrate having a small thermal shrinkage rate.

Therefore, it has been proposed to increase a strain point of the glass to reduce the thermal shrinkage rate of the glass. For example, Patent Literature 1 discloses an alkali-free glass composition having a high strain point. Patent Literature 1 also describes that the strain point increases as a β-OH value, which represents moisture content in the glass, decreases.

CITATION LIST

Patent Literature

[Patent Literature 1] JP-A-2013-151407

SUMMARY OF INVENTION

Technical Problem

As shown in FIG. 1, as the strain point increases, the thermal shrinkage rate is reduced. However, glass whose composition is designed to have a high strain point has high viscosity, thus bubble removing thereof is poor, so it is difficult to obtain glass having low bubble count.

The present invention has been made in view of the above circumstances, and an object thereof is to provide an alkali-free glass substrate having a high strain point and low bubble count, and a method for manufacturing the alkali-free glass substrate.

Solution to Problem

It is known that since alkali-free glass does not substantially contain an alkali metal oxide, it is difficult to melt a raw material batch thereof. Therefore, a melting process of melting the raw material batch is generally performed at a high temperature. The present inventors have paid attention to the fact that when the melting process is performed at a high temperature, gas generated from a fining agent is less likely to be generated in a subsequent fining process, and the present invention has thus been proposed.

That is, a method for manufacturing an alkali-free glass substrate according to the present invention includes: a batch preparing process of preparing a raw material batch so as to obtain alkali-free glass containing, in mass %, 50 to 80% of $SiO_2$, 15 to 30% of $Al_2O_3$, 0 to 4.5% of $B_2O_3$, 0 to 10% of MgO, 0 to 15% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition; a melting process of melting the prepared raw material batch; a fining process of fining molten glass; and a forming process of forming the fined glass into a sheet shape. The raw material batch is melted such that a bubble enlarging temperature of the obtained glass is lower than a maximum temperature of the fining process.

Here, the term "alkali-free glass" refers to glass that is not intentionally added with an alkali metal oxide component, and specifically has a content of alkali metal oxide ($Li_2O$, $Na_2O$, and $K_2O$) of 3000 ppm (mass) or less in glass composition thereof. The content of the alkali metal oxide in the glass composition is preferably 2000 ppm or less. The "bubble enlarging temperature" means a temperature specified by the following method. First, the obtained glass is crushed and classified, and then held at 1500° C. for 10 minutes. Thereafter, the temperature is raised from 1500° C. at a heating rate of 2° C./min, and behavior of bubbles in glass melt is observed. Three or more bubbles having a diameter of 100 μm or less are randomly selected, bubble diameters thereof are measured at every 10° C., and a temperature at which the bubble diameter becomes larger than the bubble diameter at 1500° C. by 50 μm or more is taken as the bubble enlarging temperature.

In the present invention, since the content of $B_2O_3$ in the used glass composition is low, a glass substrate having a high strain point can be obtained. However, glass having a high strain point generally has high viscosity, and is thus difficult to achieve low bubble count. Therefore, further in the method according to the present invention, the raw material batch is melted such that the bubble enlarging temperature of the obtained glass is lower than the maximum temperature of the fining process. The "bubble enlarging temperature" defined in the present invention is a temperature at which bubbles in the glass are large enough to float, so that the bubbles in the glass are sufficiently expanded and floats easily in the fining process by making the bubble enlarging temperature lower than the maximum temperature of the fining process, and thus glass having low bubble count can be obtained.

A method for manufacturing an alkali-free glass substrate according to the present invention includes: a batch preparing process of preparing a raw material batch so as to obtain alkali-free glass containing, in mass %, 50 to 80% of $SiO_2$, 15 to 30% of $Al_2O_3$, 0 to 4.5% of $B_2O_3$, 0 to 10% of MgO, 0 to 15% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition; a melting process of melting the prepared raw material batch; a fining process of fining molten glass; a forming process of forming the fined glass into a sheet shape; and an evaluation process of evaluating bubble count of the obtained glass. A bubble enlarging temperature is adjusted based on the bubble count of the obtained glass.

In the manufacturing method employing the above configuration according to the present invention, in addition to the above-mentioned effects, even when the bubble enlarging temperature temporarily becomes higher than the maximum temperature of the fining process, such a situation is easily corrected. Therefore, glass having low bubble count can be stably obtained.

In the manufacturing method according to the present invention, it is preferable to melt the raw material batch such that the bubble enlarging temperature of the obtained glass is 1550 to 1680° C.

By employing the above configuration, it is easy to make the bubble enlarging temperature of the glass lower than the maximum temperature of the fining process, and it is easy to obtain glass having low bubble count. A situation where the temperature of the fining process becomes excessively high can be easily avoided.

In the manufacturing method according to the present invention, electric melting is preferred. The "electric melting" herein is a melting method in which electricity is supplied to the glass, and the glass is heated and melted by Joule heat generated thereby. A case where radiation heating by a heater or a burner is used as a supplement is not excluded.

By employing the above configuration, an increase in moisture in the atmosphere can be suppressed. As a result, it is possible to greatly suppress moisture supply from the atmosphere to the glass, and it is easy to manufacture glass having a high strain point. The glass melt is heated by using heat generated by the glass itself (Joule heat), so that the glass can be efficiently heated. Therefore, it is possible to melt the raw material batch at a relatively low temperature, and it is easy to lower the bubble enlarging temperature.

In the manufacturing method according to the present invention, radiation heating by burner combustion is preferably not used in combination. The term "not using radiation heating by burner combustion" means not performing radiation heating by burner combustion during normal production, and does not exclude use of burner at the time of production startup (when raising the temperature). A case where radiation heating by a heater is used in combination at the time of production startup or during normal production is not excluded. The "time of production startup" refers to a period until a raw material batch dissolves to be a glass melt and electric heating is possible.

By employing the above configuration, moisture content contained in the atmosphere in a melting furnace is extremely small, and the moisture supplied from the atmosphere into the glass can be greatly reduced. As a result, it is possible to manufacture glass having extremely low moisture content. Equipment such as burner, flue, fuel tank, fuel supply path, air supply device (in the case of air combustion), oxygen generating device (in the case of oxygen combustion), exhaust gas processing device, and dust collector which is necessary for combustion heating is not required, or can be greatly simplified, so that the melting furnace can be made compact and equipment costs can be reduced. It is possible to melt the raw material batch at a low temperature, and it is easy to lower the bubble enlarging temperature.

In the manufacturing method according to the present invention, a chloride is preferably added to the raw material batch.

The chloride has the effect of reducing moisture in the glass. When the moisture contained in the glass decreases, the strain point of the glass increases. Therefore, by employing the above configuration, it is easy to manufacture glass having a high strain point.

In the manufacturing method according to the present invention, it is preferable not to add a raw material serving as a boron source to the raw material batch.

Since a glass raw material serving as a boron source is hygroscopic and may contain water of crystallization, moisture is likely to be introduced into the glass. Therefore, if the above configuration is employed, it is possible to further reduce the moisture content of the obtained glass. Since a boron component ($B_2O_3$) is a component that tends to decrease the strain point of the glass, glass having a high strain point can be easily obtained by employing the above configuration.

In the manufacturing method according to the present invention, a boric anhydride is preferably used in at least a part of a glass raw material serving as a boron source.

By employing the above configuration, it is possible to further reduce the moisture content of the obtained glass. Since the boron component ($B_2O_3$) is a component that improves meltability of the glass, if the above configuration is employed, glass having excellent production efficiency can be easily obtained.

In the manufacturing method according to the present invention, the raw material batch preferably contains no hydroxide raw material.

By employing the above configuration, it is possible to further reduce the moisture content of the obtained glass.

In the manufacturing method according to the present invention, it is preferable that a glass cullet is added to the raw material batch to manufacture the alkali-free glass substrate, and the glass cullet includes, as at least a part thereof, a glass cullet made of glass having a β-OH value of 0.4/mm or less. Here, the term "glass cullet" means defective glass produced during glass production, recycled glass recycled from the market, or the like. The "β-OH value" refers to a value obtained by measuring transmittance of glass using FT-IR and using the following formula.

β-OH value=$(1/X)\log(T1/T2)$

X: glass thickness (mm)
T1: transmittance (%) at a reference wavelength of 3846 $cm^{-1}$
T2: minimum transmittance (%) around a hydroxyl absorption wavelength of 3600 $cm^{-1}$ Since the alkali-free glass has high volume resistance, the alkali-free glass tends to be difficult to melt as compared with glass containing an alkali. Therefore, when the above configuration is employed, the glass can be easily melted, and the moisture content of the obtained glass can be further reduced.

In the manufficturing method according to the present invention, it is preferable to adjust the glass raw material and/or a melting condition such that the obtained glass has a β-OH value of 0.2/mm or less.

By employing the above configuration, it is easy to obtain glass having a low strain point and high thermal shrinkage rate.

In the manufacturing method according to the present invention, the strain point of the obtained glass is preferably higher than 700° C. Here, the "strain point" is a value measured based on a method of ASTM C336-71.

By employing the above configuration, it is possible to obtain glass having an extremely low thermal shrinkage rate.

In the manufacturing method according to the present invention, the thermal shrinkage rate of the obtained glass is preferably 20 ppm or less. Here, the "thermal shrinkage rate" is a value measured after the glass is heated at a rate of 5° C./min from room temperature to 500° C., held at 500° C. for 1 hour, and then heat treated under a condition where the temperature is lowered at a rate of 5° C./min.

By employing the above configuration, a glass substrate which is suitable for forming a low-temperature polysilicon TFT can be obtained.

A method for manufacturing an alkali-free glass substrate according to the present invention includes: a batch preparing process of preparing a raw material batch so as to obtain alkali-free glass having a strain point of 700° C. or more; a melting process of melting the prepared raw material batch; a fining process of fining molten glass; and a forming process of forming the fined glass into a sheet shape. The raw material batch is melted such that a bubble enlarging temperature of the obtained glass is lower than a maximum temperature of the fining process.

A method for manufacturing an alkali-free glass substrate according to the present invention includes: a batch preparing process of preparing a raw material batch so as to obtain aluminosilicate-based alkali-free glass having a $B_2O_3$ content of 0 to 4.5% by mass; a melting process of melting the prepared raw material batch; a fining process of fining molten glass; and a forming process of forming the fined glass into a sheet shape. The raw material batch is melted such that a bubble enlarging temperature of the obtained glass is lower than a maximum temperature of the fining process. Here, the term "aluminosilicate-based" refers to glass composition containing $SiO_2$ and $Al_2O_3$ as main components. More specifically, the term refers to glass composition which contains 50 to 80% of $SiO_2$ and 15 to 30% of $Al_2O_3$ by mass.

An alkali-free glass substrate according to the present invention contains glass which contains, in mass %, 50 to 80% of $SiO_2$, 15 to 30% of $Al_2O_3$, 0 to 4.5% of $B_2O_3$, 0 to 10% of MgO, 0 to 15% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition. A bubble enlarging temperature of the alkali-free glass substrate is 1550 to 1680° C.

A β-OH value of the alkali-free glass substrate according to the present invention is preferably 0.2/mm or less.

A strain point of the alkali-free glass substrate according to the present invention is preferably higher than 700° C.

A thermal shrinkage rate of the alkali-free glass substrate according to the present invention is preferably 20 ppm or less.

The alkali-free glass substrate according to the present invention is preferably used as a glass substrate on which a low-temperature p-Si TFT is formed.

The low-temperature polysilicon TFT has a high heat treatment temperature (around 450 to 600° C.) when formed on a substrate, and has a finer circuit pattern. Therefore, a glass substrate used for this type of application needs to have a particularly low thermal shrinkage rate. Therefore, the advantage of employing the glass substrate according to the present invention, which has a high strain point, is extremely large.

The alkali-free glass substrate according to the present invention has a strain point of 700° C. or more and a bubble enlarging temperature of 1550 to 1680° C.

The alkali-free glass substrate according to the present invention is formed by aluminosilicate-based alkali-free glass having a $B_2O_3$ content of 0 to 4.5 mass %. A bubble enlarging temperature thereof is 1550 to 1680° C.

DESCRIPTION OF EMBODIMENTS

Figure 1:
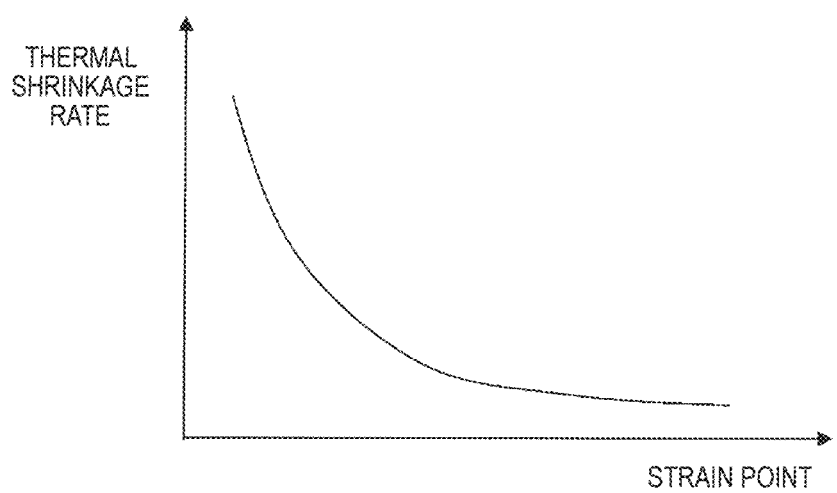
FIG. 1 is a graph showing a relationship between a strain point and a thermal shrinkage rate of glass.

A method for manufacturing an alkali-free glass substrate according to the present invention will be described in detail below.

The method according to the present invention is a method of continuously manufacturing an alkali-free glass substrate, which includes: a batch preparing process of preparing a raw material batch; a melting process of melting the prepared raw material batch; a fining process of fining molten glass; and a forming process of forming the fined glass. Each process will be described in detail below.

(1) Batch Preparing Process

First, a glass raw material is prepared so as to obtain desired alkali-free glass. For example, the glass raw material can be prepared so as to manufacture alkali-free glass having a strain point of 700° C. or more. The glass raw material can be prepared so as to manufacture aluminosilicate-based alkali-free glass having a $B_2O_3$ content of 0 to 4.5 mass %. More specifically, it is preferable to prepare a glass raw material so as to obtain alkali-free glass containing, in mass %, 50 to 80% of $SiO_2$, 15 to 30% of $Al_2O_3$, 0 to 4.5% of $B_2O_3$, 0 to 10% of MgO, 0 to 15% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition. Reasons for limiting the content of each component as described above will be described below. In the following description of each component, % refers to mass %, unless otherwise specified. Raw materials to be used will be described below.

$SiO_2$ is a component that forms a network of the glass. The content of $SiO_2$ is preferably 50 to 80%, 50 to 77%, 50 to 75%, 50 to 73%, 50 to 71%, 50 to 70%, 50 to 69%, 50 to 68%, 51 to 67%, 51 to 66%, 51.5 to 65%, and particularly preferably 52 to 64%. When the content of $SiO_2$ is too small, density becomes excessively high, and acid resistance tends to decrease. On the other hand, when the content of $SiO_2$ is too large, viscosity in high temperature is increased, and meltability tends to decrease. Devitrified crystals, such as cristobalite, tend to be precipitated, and a liquidus temperature tends to rise.

$Al_2O_3$ is a component that forms the network of the glass, and is a component that increases strain point and Young's modulus, and further inhibits phase separation. The content of $Al_2O_3$ is preferably 15 to 30%, 15 to 27%, 15 to 26%, 15 to 25%, 15 to 24%, 15 to 23%, 15.5 to 22%, 16 to 21.5%, 16.5 to 21%, and particularly preferably 17 to 20.5%. When the content of $Al_2O_3$ is too small, the strain point and the Young's modulus tend to decrease, and the glass tends to be phase separated. On the other hand, when the content of $Al_2O_3$ is too large, devitrified crystals such as mullite or anorthite tends to precipitate, and the liquidus temperature tends to rise.

$B_2O_3$ is a component for enhancing meltability and enhancing devitrification resistance. The content of $B_2O_3$ is preferably 0 to 4.5%, 0 to 4.0%, 0 to 3.5%, 0 to 3%, 0 to 2.5%, 0 to 2%, 0 to 1.9%, 0 to 1.8%, 0 to 1.7%, and particularly preferably 0.1 to 1.6%. When the content of $B_2O_3$ is too small, meltability and devitrification resistance tend to decrease, and resistance to hydrofluoric acid-based chemical liquid tends to decrease. On the other hand, when the content of $B_2O_3$ is too large, the strain point and the Young's modulus tend to decrease. Further, an amount of moisture brought in from a batch increases.

MgO is a component that reduces viscosity in high temperature and enhances meltability, and is a component that remarkably increases the Young's modulus in alkaline earth metal oxides. The content of MgO is preferably 0 to 10%, 0 to 9%, 1 to 8%, 1 to 7%, 1.5 to 7.5%, and particularly preferably 2 to 6%. When the content of MgO is too small, the meltability and the Young's modulus tend to decrease. On the other hand, when the content of MgO is too large, the devitrification resistance tends to decrease, and the strain point tends to decrease.

CaO is a component that reduces viscosity in high temperature without decreasing the strain point and remarkably enhances the meltability. Since the introduced raw material is relatively inexpensive among alkaline earth metal oxides, a cost of the raw material is reduced. The content of CaO is preferably 0 to 15%, 0 to 13%, 0 to 12%, 0 to 11%, 0 to 10%, 1 to 10%, 2 to 9%, 2.5 to 8%, 3 to 8%, 3.5 to 7%, and particularly preferably 4 to 6%. When the content of CaO is too small, it is difficult to obtain the above effects. On the other hand, when the content of CaO is too large, the glass tends to devitrify, and a thermal expansion coefficient tends to increase.

SrO is a component that inhibits phase separation and enhances the devitrification resistance. Further, SrO is a component that reduces viscosity in high temperature and enhances the meltability without decreasing the strain point. In addition, SrO is a component that inhibits an increase in the liquidus temperature. The content of SrO is preferably 0 to 10%, 0 to 9%, 0 to 8%, 0.5 to 7.5%, and particularly preferably 0.5 to 7%. When the content of SrO is too small, it is difficult to obtain the above effects. On the other hand, when the content of SrO is too large, strontium silicate-based devitrified crystals tend to be precipitated, and the devitrification resistance tends to decrease.

BaO is a component that remarkably enhances the devitrification resistance. The content of BaO is preferably 0 to 15%, 0 to 14%, 0 to 13%, 0 to 12%, and particularly preferably 0.5 to 10.5%. When the content of BaO is too small, it is difficult to obtain the above effects. On the other hand, when the content of BaO is too large, the density is excessively high and the meltability tends to decrease. In addition, devitrified crystals containing BaO tend to be precipitated, and the liquidus temperature tends to rise.

ZnO is a component that enhances the meltability. However, when a large amount of ZnO is contained, the glass tends to devitrify, and the strain point tends to decrease. The content of ZnO is preferably 0 to 5%, 0 to 4%, 0 to 3%, and particularly preferably 0 to 2%.

$ZrO_2$ is a component that enhances chemical durability. However, when a large amount of $ZrO_2$ is contained, devitrification of $ZrSiO_4$ tends to occur. The content of $ZrO_2$ is preferably 0 to 5%, 0 to 4%, 0 to 3%, 0 to 2%, and particularly preferably 0 to 0.1%.

$TiO_2$ is a component that reduces viscosity in high temperature and enhances the meltability. Further, $TiO_2$ is a component that inhibits solarization. However, when a large amount of $TiO_2$ is contained, the glass is colored, and transmittance tends to decrease. The content of $TiO_2$ is preferably 0 to 5%, 0 to 4%, 0 to 3%, 0 to 2%, and particularly preferably 0 to 0.1%.

$P_2O_5$ is a component that increases the strain point, and is a component capable of inhibiting precipitation of alkaline earth aluminosilicate-based devitrified crystals, such as anorthite. However, when a large amount of $P_2O_5$ is contained, the glass tends to be phase-separated. The content of $P_2O_5$ is preferably 0 to 15%, 0 to 13%, 0 to 12%, 0 to 11%, 0 to 10%, 0 to 9%, 0 to 8%, 0 to 7%, 0 to 6%, and particularly preferably 0 to 5%.

$SnO_2$ is a component having good fining action in a high temperature region, a component that increases the strain point, and a component that reduces viscosity in high temperature. In addition, there is an advantage that $SnO_2$ does not erode a molybdenum electrode. The content of $SnO_2$ is preferably 0 to 0.5%, 0.001 to 0.5%, 0.001 to 0.45%, 0.001 to 0.4%, 0.01 to 0.35%, 0.1 to 0.3%, and particularly preferably 0.15 to 0.3%. When the content of $SnO_2$ is too large, devitrified crystals of $SnO_2$ tend to be precipitated, and precipitation of devitrified crystals of $ZrO_2$ tends to be promoted. When the content of $SnO_2$ is less than 0.001%, it is difficult to obtain the above effects.

In addition to the above components, other components such as Cl and F can be contained in a total amount of 10% or less, particularly preferably 5% or less. However, it is preferable that $As_2O_3$ and $Sb_2O_3$ are not substantially contained from the viewpoints of environment and prevention of erosion of electrodes. Here, "being not substantially contained" means that a glass raw material or glass cullet containing such components is not intentionally added to a glass batch. More specifically, in the obtained glass, arsenic is 50 ppm or less as $As_2O_3$, and antimony is 50 ppm or less as $Sb_2O_3$ on a mass % basis.

Next, glass raw materials constituting the batch will be described. In the following description of each raw material, % refers to mass %, unless otherwise specified.

Silica sand ($SiO_2$) or the like can be used as a silicon source.

Alumina ($Al_2O_3$), aluminum hydroxide ($Al(OH)_3$), or the like can be used as an aluminum source. Since aluminum hydroxide contains water of crystallization, when a usage ratio thereof is large, it is difficult to reduce the moisture content of the glass. Therefore, it is preferable not to use aluminum hydroxide if possible. Specifically, the usage ratio of aluminum hydroxide is preferably 50% or less, 40% or less, 30% or less, 20% or less, or 10% or less with respect to 100% of the aluminum source (in terms of $Al_2O_3$), and it is desirable not to use aluminum hydroxide if possible.

Orthoboric acid ($H_3BO_3$) or boric anhydride ($B_2O_3$) can be used as a boron source. Since orthoboric acid contains water of crystallization, when a usage ratio thereof is large, it is difficult to reduce the moisture content of the glass. Therefore, it is preferable to increase a usage ratio of the boric anhydride as much as possible. Specifically, the usage ratio of boric anhydride is preferably 50% or more, 70% or more, or 90% or more with respect to 100% of the boron source (in terms of $B_2O_3$), and it is particularly desirable that the whole boron source is made up of boric anhydride. Since both of the raw materials serving as the boron source are hygroscopic, a large amount of moisture may be introduced into the glass depending on storage conditions. Therefore, from the viewpoint of reducing the moisture content of the glass, it is particularly preferable not to contain the raw materials serving as the boron source (in other words, does not contain $B_2O_3$ in the glass composition).

Examples of alkaline earth metal sources include calcium carbonate ($CaCO_3$), magnesium oxide (MgO), magnesium hydroxide ($Mg(OH)_2$), barium carbonate ($BaCO_3$), barium nitrate ($Ba(NO_3)_2$), strontium carbonate ($SrCO_3$), and strontium nitrate ($Sr(NO_3)_2$). Since magnesium hydroxide contains water of crystallization, when a usage ratio thereof is large, it is difficult to reduce the moisture content of the glass. Therefore, it is preferable not to use magnesium hydroxide if possible. Specifically, the usage ratio of magnesium hydroxide is preferably 50% or less, 40% or less, 30% or less, 20% or less, or 10% or less with respect to 100% of a magnesium source (in terms of MgO), and it is desirable not to use magnesium hydroxide if possible.

Zinc oxide (ZnO) or the like can be used as a zinc source.

Zircon ($ZrSiO_4$) or the like can be used as a zirconia source. When a Zr-containing refractory such as zirconia electrocast refractory or dense zircon is used as a refractory which constitutes a melting furnace, zirconia components are extracted from the refractory. These extracted components may also be used as the zirconia source.

Titanium oxide ($TiO_2$) or the like can be used as a titanium source.

Aluminum metaphosphate ($Al(PO_3)_3$), magnesium pyrophosphate ($Mg_2P_2O_7$), or the like can be used as a phosphorus source.

Tin oxide ($SnO_2$) or the like can be used as a tin source. When tin oxide is used, it is preferable to use tin oxide having an average particle diameter $D_{50}$ of 0.3 to 50 μm, 2 to 50 μm, and particularly preferably 5 to 50 μm. When the average particle size $D_{50}$ of tin oxide powder is small, aggregation between particles occurs, and clogging tends to occur in a preparation plant. On the other hand, when the average particle diameter $D_{50}$ of the tin oxide powder is large, dissolution reaction of the tin oxide powder in glass melt is delayed, and fining of the melt does not proceed. As a result, the oxygen gas cannot be sufficiently released at an appropriate time of glass melting, and bubbles remain in the glass product, so that it is difficult to obtain a product having excellent bubble. In addition, such fact easily causes a situation in which undissolved $SnO_2$ crystals appear in the glass product.

From the viewpoint of limiting the moisture content of the glass, a usage ratio of hydroxide raw materials such as aluminum hydroxide or magnesium hydroxide is preferably 5% or less or 3% or less with respect to the batch, and it is desirable not to use hydroxide raw materials.

Further, in the present invention, chloride may be contained in the batch. The chloride functions as a dehydrating agent that greatly reduces the moisture content of the glass. In addition, the chloride has an effect of promoting action of a tin compound which serves as a fining agent. Further, the chloride is decomposed and volatilized in a temperature range of 1200° C. or higher to generate a fining gas, and a formation of heterogeneous layers is inhibited by a stirring effect thereof. In addition, the chloride has an effect of capturing and dissolving silica raw materials such as silica sand during decomposition of the chloride. Chlorides of alkaline earth metals such as strontium chloride, aluminum chloride, or the like can be used as the chloride.

In the present invention, it is desirable that the batch is substantially free of arsenic compounds and antimony compounds. A molybdenum electrode is eroded when such components are contained, so it becomes difficult to stably perform electric melting over a long period of time. In addition, such components are environmentally unfriendly.

In the present invention, glass cullet is preferably used in addition to the above-described glass raw materials. When the glass cullet is used, the usage ratio of the glass cullet with respect to a total amount of the raw material batch is preferably 1% by mass or more, 5% by mass or more, and particularly preferably 10% by mass or more. Although an upper limit of the usage ratio of the glass cullet is not limited, the usage ratio is preferably 50% by mass or less, 40% by mass or less, and particularly preferably 30% by mass or less. It is desirable that at least a part of the glass cullet to be used is low moisture glass cullet composed of glass having a β-OH value of 0.4/mm or less, 0.35/mm or less, 0.3/mm or less, 0.25/mm or less, 0.2/mm or less, 0.18/mm or less, 0.17/mm or less, 0.16/mm or less, and particularly preferably 0.15/mm or less. Although a lower limit value of the β-OH value of the low moisture glass cullet is not particularly limited, the β-OH value is practically 0.01/mm or more.

An amount of the low moisture glass cullet to be used is preferably 50% by mass or more, 60% by mass or more, 70% by mass or more, 80% by mass or more, or 90% by mass or more with respect to a total amount of the glass cullet to be used, and it is particularly desirable that all of the glass cullet to be used is low moisture glass cullet. When the β-OH value of the low moisture glass cullet is not sufficiently low or when the usage ratio of the low moisture glass cullet is small, the effect of reducing the β-OH value of the obtained glass becomes small.

It should be noted that the glass raw material, the glass cullet, or the raw material batch prepared by mixing these materials may contain moisture. In addition, moisture in the atmosphere may be absorbed during storage. Therefore, in the present invention, it is preferable to introduce dry air into a raw material silo for weighing and supplying each glass raw material and a pre-furnace silo for introducing the prepared raw material batch into a melting furnace.

(2) Melting Process

Next, the prepared raw material batch is melted such that a bubble enlarging temperature is lower than a maximum temperature in the fining process. In order to reduce the bubble enlarging temperature, a maximum temperature in the melting furnace may be lowered. For example, in a case where electric melting is performed without using burner combustion in combination, the maximum temperature can be adjusted by changing a temperature in the vicinity of a bottom surface of an electrode of the melting furnace.

A melting furnace that can be heated by radiant heat generated by burner combustion or Joule heat generated by energization between electrodes is used to melt the raw material batch. In particular, it is preferable to use a melting furnace capable of performing electric melting.

The melting furnace capable of performing electric melting includes a plurality of electrodes made of molybdenum, platinum, tin, or the like, electricity is supplied to the glass melt by applying electricity between these electrodes, and the glass is continuously melted by the Joule heat thereof. Although radiation heating by a heater or a burner may be used in combination, it is desirable to use electric melting completely without using the burner from the viewpoint of reducing the β-OH value of the glass. When the heating is performed by the burner, moisture generated by combustion is taken into the glass, making it difficult to sufficiently reduce the moisture content of the glass.

A molybdenum electrode is preferably used as the electrode. Since the molybdenum electrode has a high degree of freedom in arrangement location and electrode shape, optimal electrode arrangement and electrode shape can be adopted even for alkali-free glass that is difficult to conduct electricity, thereby facilitating electric heating. The electrode shape is preferably a rod shape. In a case where the rod shape is adopted, it is possible to arrange a desired number of electrodes at any position on a side wall surface or a bottom wall surface of the melting furnace while maintaining desired inter-electrode distances. It is desirable to arrange a plurality of pairs of electrodes on wall surfaces (side wall surface, bottom wall surface and the like) of the melting furnace, particularly on the bottom wall surface, to shorten the inter-electrode distance. When an arsenic component or an antimony component is contained in the glass, the molybdenum electrode cannot be used due to the reason described above, and instead it is necessary to use a tin electrode which will not be eroded by such components. However, since the tin electrode has a very low degree of freedom in arrangement location and electrode shape, it is difficult to melt the alkali-free glass by electric melting.

The raw material batch supplied to the melting furnace is melted by radiant heat or Joule heat, and becomes glass melt (molten glass). In a case where the chloride is contained in the raw material batch, the chloride is decomposed and volatilized to bring the moisture in the glass into the atmosphere, thereby reducing the β-OH value of the glass. Polyvalent oxides such as tin compounds contained in the raw material batch dissolve in the glass melt and acts as fining agents. For example, the tin components release oxygen bubbles during a heating process. The released oxygen bubbles expand and float bubbles contained in the glass melt and remove the bubbles from the glass. In a cooling process, the tin components absorb oxygen bubbles, thereby eliminating bubbles remaining in the glass.

(3) Fining Process

Next, the molten glass is heated and fined. The fining process may be performed in an independent fining tank, or may be performed in a downstream portion or the like in the melting furnace.

The molten glass supplied to the fining process is melted in the melting process such that the bubble enlarging temperature is lower than the maximum temperature in the fining process (hereinafter, referred to as the maximum fining temperature). When the temperature of the glass melt becomes higher than that at the time of melting, oxygen bubbles are released from fining agent components due to the above-described reaction, and bubbles contained in the glass melt can be expanded, floated, and removed from the glass. At this time, a fining effect can be more improved as a difference between the melting temperature and the fining temperature is large. Therefore, it is desirable to minimize the melting temperature. The bubble enlarging temperature is a standard of the melting temperature.

The bubble enlarging temperature can be obtained by re-melting the obtained glass by the following procedure. First, the obtained glass is crushed and classified to 2.0 to 5.6 mm. 15 g of classified glass is placed in a quartz tube and held at 1500° C. for 10 minutes. Thereafter, the temperature is raised from 1500° C. at a heating rate of 2° C./min, and behavior of bubbles in glass melt is observed. A moving image or an observation image extracted from the moving image is used to measure the bubble enlarging temperature as follows. Three or more bubbles having a diameter of 100 µm or less are randomly selected, and bubble diameters thereof are measured at every 10° C. A temperature at which an expansion length of the bubble diameter became equal to or larger than 50 µm is taken as the bubble enlarging temperature. In a case where the selected bubbles absorb other bubbles and the bubble diameter is increased, it is necessary to restart the procedure from the selection of the bubbles. In consideration of the burden on the equipment, it is desirable to raise the temperature up to 1680° C., particularly preferably 1650° C.

The bubble enlarging temperature is preferably 1550 to 1680° C., 1550 to 1660° C., 1550 to 1650° C., 1550 to 1640° C., 1550 to 1630° C., 1550 to 1625° C., and particularly preferably 1550 to 1620° C. The maximum temperature in the fining process is preferably in a range of 1560° C. to 1700° C., 1560° C. to 1680° C., 1565° C. to 1670° C., 1570° C. to 1660° C., 1575° C. to 1650° C., 1580° C. to 1645° C., and particularly preferably 1585° C. to 1640° C. The temperature difference between the bubble enlarging temperature and the maximum fining temperature is preferably 15° C. or more, 20° C. or more, and particularly preferably 25° C. or more. The fining effect is improved as the temperature difference between the bubble enlarging temperature and the maximum fining temperature increases. In addition, the number of bubbles in the obtained glass sheet does not easily increase even when melting conditions fluctuate. Although an upper limit of the temperature difference between the bubble enlarging temperature and the maximum fining temperature is not limited, the temperature difference is preferably 200° C. or less, 170° C. or less, and particularly preferably 150° C. or less in practical use.

(4) Forming Process

Next, fined glass is supplied to a forming device and formed into a sheet shape. A stirring tank, a state adjusting tank or the like may be arranged between the fining tank and the forming device, and the glass may be supplied to the forming device after passing through such devices. In order to prevent contamination of the glass, it is preferable that at least a contact surface contacting the glass is made of platinum or a platinum alloy in a connection flow path connecting the melting furnace, the fining tank and the forming device (or each tank provided therebetween).

Although a forming method is not particularly limited, the effect of the present invention can be easily obtained by employing a downdraw method in which a length of an annealing furnace is limited and the thermal shrinkage rate is hardly reduced. It is preferable to employ an overflow downdraw method as the downdraw method. The overflow downdraw method is a method in which molten glass overflows from both sides of a forming refractory having a wedge-shaped cross section, and the overflowing molten glass is joined at the lower end of the forming refractory and is stretched downward to form the glass into a sheet shape. In the overflow downdraw method, the surface to be the surface of the glass substrate is not in contact with the forming refractory, and is formed in the state of the free surface. Therefore, a glass substrate having good surface quality without being polished can be manufactured at a low cost, and the size of the glass can be easily increased and thickness of the glass can be easily decreased. The structure and material of the forming refractory used in the overflow downdraw method are not particularly limited as long as the structure and material thereof can achieve desired dimensions and surface accuracy. A method of applying a force when the downward drawing forming is performed is not particularly limited. For example, a drawing method in which a heat-resistant roll having a sufficiently large width is rotated in a state of being in contact with the glass, or a method of drawing a plurality of pairs of heat-resistant rolls in contact only in the vicinity of the end surface of the glass, may be employed. In addition to the overflow downdraw method, for example, a slot down method or the like can be employed.

The glass formed into the sheet shape in this manner is cut into a predetermined size, subjected to various chemical or mechanical processing as necessary to obtain a glass substrate.

(5) Evaluation Process

In the present invention, there may be an evaluation process of evaluating bubble count of the obtained glass. It is preferable to adjust the bubble enlarging temperature based on a bubble count evaluation result in this process. For example, when the bubble count is below a standard, the bubble enlarging temperature may be above the maximum fining temperature. In such a case, it is necessary to adjust the bubble enlarging temperature. The adjustment of the bubble enlarging temperature can be performed by changing conditions of the melting process in (2). Specifically, the bubble enlarging temperature can be adjusted by changing a maximum temperature in the melting furnace (for example, a temperature in the vicinity of the bottom surface in the case of electric melting without using burner combustion in combination).

Next, an alkali-free glass substrate which can be manufactured by the method according to the present invention will be described. Composition and bubble enlarging temperature of the alkali-free glass substrate are as described above, and a description thereof will be omitted here.

The alkali-free glass substrate obtained by the method according to the present invention preferably has a thermal shrinkage rate of 20 ppm or less, 18 ppm or less, 17 ppm or less, 16 ppm or less, 15 ppm or less, 14 ppm or less, 13 ppm or less, 12 ppm or less, 11 ppm or less, and particularly preferably 10 ppm or less after heating the glass from a room temperature to 500° C. at a rate of 5° C./min, maintaining the glass at 500° C. for 1 hour, and cooling the glass at a rate of 5° C./min. When the thermal shrinkage rate is large, it is difficult to use the alkali-free substrate as a substrate on which a low-temperature polysilicon TFT is formed.

The alkali-free glass substrate obtained by the method according to the present invention is preferably made of glass having a β-OH value of 0.2/mm or less, 0.18/mm or less, 0.16/mm or less, and particularly preferably 0.15/mm or less. Although a lower limit value of the β-OH value is not limited, the β-OH value is preferably 0.01/mm or more, and particularly preferably 0.05/mm or more. When the β-OH value is large, the strain point of the glass is not sufficiently high, and it is difficult to remarkably reduce the thermal shrinkage rate.

The alkali-free glass obtained by the method according to the present invention preferably has a strain point of 700° C. or more, more than 700° C., 705° C. or more, 710° C. or more, 720° C. or more, and particularly preferably 725° C. or more. This makes it easy to reduce thermal shrinkage of the glass substrate in a process of manufacturing the low-temperature polysilicon TFT. When the strain point is too high, the temperature during forming and melting becomes excessively high, and a manufacturing cost of the glass substrate tends to increase. Accordingly, the alkali-free glass obtained by the method according to the present invention preferably has a strain point of 850° C. or less, 830° C. or less, 820° C. or less, 810° C. or less, 800° C. or less, 790° C. or less, and particularly preferably 780° C. or less.

The alkali-free glass substrate obtained by the method according to the present invention is preferably made of glass having a temperature corresponding to $10^{4.5}$ dPa·s of 1370° C. or less, 1360° C. or less, 1350° C. or less, 1345° C. or less, 1340° C. or less, 1335° C. or less, 1330° C. or less, and particularly preferably 1325° C. or less. When the temperature at $10^{4.5}$ dPa·s is increased, the temperature during forming is excessively high, and the manufacturing cost of the glass substrate tends to increase. The "temperature corresponding to $10^{4.5}$ dPa·s" is a value measured by a platinum ball lifting method.

The alkali-free glass substrate obtained by the method according to the present invention is preferably made of glass having a temperature at $10^{2.5}$ dPa·s of 1700° C. or less, 1690° C. or less, 1680° C. or less, 1670° C. or less, 1660° C. or less, and particularly preferably 1650° C. or less. When the temperature at $10^{2.5}$ dPa·s is high, it is difficult to melt the glass, the manufacturing cost of the glass substrate is increased, and defects such as bubbles tend to occur. The "temperature corresponding to $10^{2.5}$ dPa·s" is a value measured by the platinum ball lifting method.

The alkali-free glass obtained by the method according to the present invention is preferably made of glass having a liquidus temperature of less than 1300° C., less than 1290° C., less than 1280° C., less than 1270° C., less than 1260° C., and particularly preferably less than 1250° C. This makes it difficult to generate devitrified crystals at the time of manufacturing the glass, and makes it easy to prevent a decrease in production efficiency. Further, since it is easy to form the glass substrate by the overflow downdraw method, the surface quality of the glass substrate can be easily improved, and the manufacturing cost of the glass substrate can be reduced. From the viewpoint of increasing the size of the glass substrate and high definition of displays in recent years, it is very important to enhance devitrification resistance, so as to minimize devitrification which may cause surface defects. The liquidus temperature is an index of devitrification resistance, and the devitrification resistance becomes better as the liquidus temperature decreases. The "liquidus temperature" refers to a temperature at which devitrification (crystal foreign matter) is recognized in the glass after placing glass powder passing through a 30 mesh standard sieve (500 μm) and remaining in a 50 mesh standard sieve (300 μm) in a platinum boat, holding in a temperature gradient furnace set at 1100° C. to 1350° C. for 24 hours, and then taking out the platinum boat.

The alkali-free glass substrate obtained by the method according to the present invention is preferably made of glass having viscosity of $10^{4.0}$ dPa·s or more, $10^{4.1}$ dPa·s or more, $10^{4.2}$ dPa·s or more, $10^{4.3}$ dPa·s or more, $10^{4.4}$ dPa·s or more, $10^{4.5}$ dPa·s or more, $10^{4.6}$ dPa·s or more, $10^{4.7}$ dPa·s or more, $10^{4.8}$ dPa·s or more, $10^{4.9}$ dPa·s or more, and particularly preferably $10^{5.0}$ dPa·s or more at the liquidus temperature. In this way, since devitrification hardly occurs at the time of forming, the glass substrate can be easily formed by the overflow downdraw method, and as a result, the surface quality of the glass substrate can be enhanced, and the manufacturing cost of the glass substrate can be reduced. The viscosity at the liquidus temperature is an index of formability, and the formability becomes better as the viscosity at the liquidus temperature increases. The "viscosity at the liquidus temperature" refers to the viscosity of the glass at the liquidus temperature, and can be measured by, for example, the platinum ball lifting method.

EXAMPLE

Example 1

Figure 2:
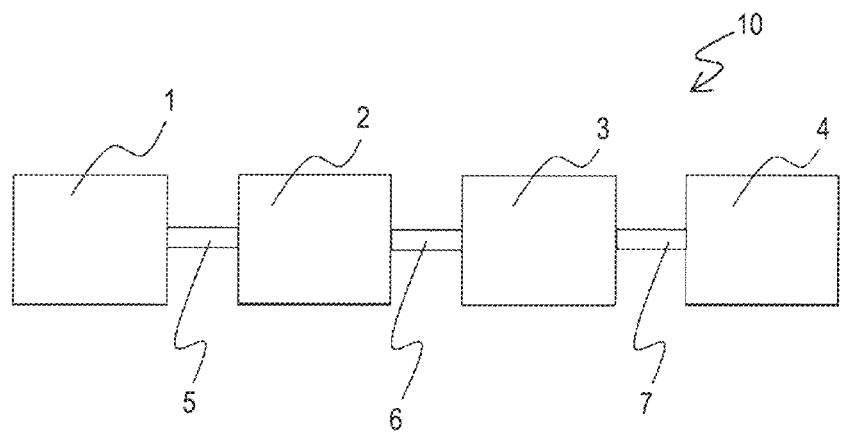
FIG. 2 is an explanatory diagram showing a schematic configuration of a glass manufacturing device for performing a manufacturing method according to the present invention.

Examples of the manufacturing method according to the present invention will be described below. FIG. 2 is an explanatory diagram showing a schematic configuration of a preferred glass manufacturing device 10 for performing the manufacturing method according to the present invention.

First, a configuration of the glass manufacturing device will be described. The glass manufacturing device 10 includes: a melting furnace 1 which electrically melts the raw material batch; a fining tank 2 provided downstream of the melting furnace 1; an adjusting tank 3 provided downstream of the fining tank 2, a forming device 4 provided downstream of the adjusting tank 3. The melting furnace 1, the fining tank 2, the adjusting tank 3, and the forming device 4 are connected by connection flow paths 5, 6, and 7, respectively.

The melting furnace 1 includes a bottom wall, a side wall, and a ceiling wall, each of which is formed of a high zirconia-based refractory such as $ZrO_2$ electrocast refractory or dense zircon. The side wall is designed to be thin in wall thickness to facilitate cooling of the refractory. A plurality of pairs of molybdenum electrodes are provided on lower portions of the side wall on left and right sides and the bottom wall. Each electrode is provided with a cooling unit such that a temperature of the electrode does not rise excessively. By applying electricity between the electrodes, the glass can be electrically heated directly. In the example, a burner (except for a burner used during production start-up) or a heater used in normal production is not provided.

The side wall upstream of the melting furnace 1 is provided with an inlet for a raw material supplied from a pre-furnace silo (not shown), and the side wall downstream thereof is formed with an outlet, and the melting furnace 1 and the fining tank 2 are connected with each other via the narrow width connection flow path 5 which includes the outlet at an upstream end.

The fining tank 2 includes a bottom wall, a side wall, and a ceiling wall, each of which is formed of a high zirconia-based refractory. The connection flow path 5 includes a bottom wall, a side wall, and a ceiling wall, each of which is formed of a high zirconia-based refractory such as $ZrO_2$ electrocast refractory. The fining tank 2 has a smaller volume than the melting furnace 1, and inner wall surfaces of the bottom wall and the side wall (at least an inner wall surface portion in contact with molten glass) are attached with platinum or a platinum alloy, and inner wall surfaces of the bottom wall and the side wall of the connection flow path 5 are also attached with platinum or a platinum alloy. A downstream end of the connection flow path 5 is opened in the upstream side wall of the fining tank 2. The fining tank 2 is a portion where the fining of the glass is mainly performed. Fine bubbles contained in the glass are expanded and floated by the fining gas released from the fining agent, and are removed from the glass.

An outlet is formed in the side wall downstream of the fining tank 2, and the adjusting tank 3 is connected with the fining tank 2 via the narrow width connection flow path 6 which includes the outlet at an upstream end.

The adjusting tank 3 includes a bottom wall, a side wall, and a ceiling wall, each of which is formed of a high zirconia-based refractory. The connection flow path 6 includes a bottom wall, a side wall, and a ceiling wall, each of which is formed of a high zirconia-based refractory such as $ZrO_2$ electrocast refractory. Inner wall surfaces of the bottom wall and the side wall of the adjusting tank 3 (at least an inner wall surface portion in contact with molten glass) are attached with platinum or a platinum alloy, and inner wall surfaces of the bottom wall and the side wall of the connection flow path 7 are also attached with platinum or a platinum alloy. The adjusting tank 3 is a portion that mainly adjusts the glass to a state suitable for forming, and gradually decreases the temperature of the molten glass to adjust the viscosity to a viscosity suitable for forming.

An outlet is formed in the side wall downstream of the adjusting tank 3, and the forming device 4 is connected with the adjusting tank 3 via the narrow width connection flow path 7 which includes the outlet at an upstream end.

The forming device 4 is a downdraw forming device, for example an overflow downdraw forming device. The inner wall surfaces of the bottom wall and the side wall of the connection flow path 7 are attached with platinum or a platinum alloy.

A supply path in the present embodiment refers to a path from the connection flow path 5 provided downstream of the melting furnace to the connection flow path 7 provided upstream of the forming device. Although a glass manufacturing device including each portion of the melting furnace, the fining tank, the adjusting tank, and the forming device is exemplified, it is also possible to provide a stirring tank, which stirs and homogenizes the glass, between the adjusting tank and the forming device, for example. Further, although it has been shown that the refractory in each of the above-mentioned devices is attached with platinum or a platinum alloy, it is needless to say that devices composed of platinum or a platinum alloy may be used instead.

A method of using the glass manufacturing device having the above configuration to manufacture glass will be described.

First, glass raw materials (and glass cullet) are mixed and prepared so as to have a desired composition.

Subsequently, the prepared glass raw material is fed into the melting furnace 1, melted and vitrified. In the melting furnace 1, a voltage is applied to the molybdenum electrode and the glass is electrically heated directly. In the example, since radiation heating by the burner combustion is not performed, moisture in the atmosphere does not increase, and an amount of moisture supplied from the atmosphere into the glass is remarkably reduced. The temperature in the vicinity of the bottom surface in the melting furnace is adjusted such that the bubble enlarging temperature is lower than the maximum fining temperature.

In the present embodiment, the glass raw material is heated by using a burner when the production is started, and the burner is stopped at the time when the glass raw material fed at first is liquefied, and the procedure proceeds to direct electric heating.

The molten glass vitrified in the melting furnace 1 is guided to the fining tank 2 through the connection flow path 5. The molten glass contains a large number of bubbles caused by gas generated during vitrification reaction and bubbles caused by air trapped between raw material particles during the vitrification. Such bubbles are expanded, floated and removed in the fining tank 2 by fining gas released from $SnO_2$, which is a fining agent component.

The molten glass fined in the fining tank 2 is guided to the adjusting tank 3 through the connection flow path 6. The molten glass guided to the adjusting tank 3 has a high temperature and low viscosity, and cannot be formed directly by the forming device 4. Therefore, the temperature of the glass is reduced in the adjusting tank 3 and the glass is adjusted to the viscosity suitable for forming.

The molten glass whose viscosity is adjusted in the adjusting tank 3 is guided to the overflow downdraw forming device 4 through the connection flow path 7, and is formed into a thin sheet shape. Further, a glass substrate made of the alkali-free glass can be obtained by cutting, end surface processing, and the like.

According to the method described above, since the moisture supplied into the glass can be minimized, the β-OH value can be set to 0.2/mm or less, and glass having a small thermal shrinkage rate can be obtained.

Example 2

Next, the glass manufactured by using the method according to the present invention will be described. Tables 1 to 6 show Examples (No. 1 to 4, 8 to 27, 29 to 39) and Comparative Examples (No. 5 to 7, 28, 40 to 42) of the present invention.

TABLE 1

| | No. | 1 | 2 | 3 | 4 | 5 | 6 | 7 |
|---|---|---|---|---|---|---|---|---|
| Glass Composition (Mass %) | $SiO_2$ | 61.1 | 61.1 | 61.1 | 61.1 | 61.1 | 61.1 | 61.1 |
| | $Al_2O_3$ | 18.6 | 18.6 | 18.6 | 18.6 | 18.6 | 18.6 | 18.6 |
| | $B_2O_3$ | 0.7 | 0.7 | 0.7 | 0.7 | 0.7 | 0.7 | 0.7 |
| | MgO | 3.2 | 3.2 | 3.2 | 3.2 | 3.2 | 3.2 | 3.2 |
| | CaO | 5.1 | 5.1 | 5.1 | 5.1 | 5.1 | 5.1 | 5.1 |
| | SrO | 0.6 | 0.6 | 0.6 | 0.6 | 0.6 | 0.6 | 0.6 |
| | BaO | 10.4 | 10.4 | 10.4 | 10.4 | 10.4 | 10.4 | 10.4 |
| | $P_2O_5$ | 0 | 0 | 0 | 0 | 0 | 0 | 0 |
| | $ZrO_2$ | 0.020 | 0.020 | 0.040 | 0.030 | 0.100 | 0.020 | 0.020 |
| | $TiO_2$ | 0.100 | 0.003 | 0.003 | 0.004 | 0.004 | 0.003 | 0.100 |
| | $SnO_2$ | 0.190 | 0.220 | 0.210 | 0.220 | 0.220 | 0.210 | 0.190 |
| | $Fe_2O_3$ | 0.010 | 0.014 | 0.013 | 0.014 | 0.013 | 0.014 | 0.010 |
| | $Cr_2O_3$ | 0.0001 | 0.0001 | 0.0001 | 0.0001 | 0.0001 | 0.0001 | 0.0001 |
| | $SO_3$ | 0.0003 | 0.0003 | 0.0003 | 0.0003 | 0.0004 | 0.0003 | 0.0003 |
| β-OH (/mm) | | 0.06 | 0.05 | 0.05 | 0.07 | 0.12 | 0.09 | 0.06 |
| Strain Point (° C.) | | 750 | 750 | 750 | 749 | 747 | 748 | 750 |
| Thermal Shrinkage Rate (ppm) | | 10 | 10 | 10 | 10 | 11 | 10 | 10 |
| Bubble enlarging Temperature (° C.) | | 1610 | 1605 | 1610 | 1590 | 1645 | 1635 | 1635 |
| Maximum Temperature of Fining Tank (° C.) | | 1630 | 1630 | 1625 | 1630 | 1630 | 1625 | 1620 |
| Maximum Temperature of Fining Tank − Bubble enlarging Temperature (° C.) | | 20 | 25 | 15 | 40 | −15 | −10 | −15 |
| Bubble count (bubble/kg) | | ○ | ○ | ○ | ⊙ | X | Δ | X |

TABLE 2

|  | No. | 8 | 9 | 10 | 11 | 12 | 13 | 14 |
|---|---|---|---|---|---|---|---|---|
| Glass Composition (Mass %) | $SiO_2$ | 58.5 | 64.1 | 61.5 | 58.5 | 55.5 | 52.5 | 61.7 |
|  | $Al_2O_3$ | 20.5 | 16.9 | 19.7 | 19.8 | 19.8 | 19.8 | 19.8 |
|  | $B_2O_3$ | 0.0 | 0.3 | 1.6 | 1.6 | 1.6 | 1.6 | 1.4 |
|  | MgO | 3.5 | 1.8 | 2.5 | 2.5 | 2.5 | 2.5 | 5.5 |
|  | CaO | 6.0 | 5.9 | 4.6 | 4.6 | 4.6 | 4.6 | 4.6 |
|  | SrO | 0.5 | 0.8 | 1.8 | 1.8 | 1.8 | 1.8 | 6.6 |
|  | BaO | 7.5 | 10.0 | 8.0 | 8.0 | 8.0 | 8.0 | 0.1 |
|  | $P_2O_5$ | 3.3 | 0 | 0 | 3.0 | 6.0 | 9.0 | 0 |
|  | $ZrO_2$ | 0.050 | 0.070 | 0.040 | 0.050 | 0.040 | 0.030 | 0.070 |
|  | $TiO_2$ | 0.008 | 0.007 | 0.008 | 0.009 | 0.007 | 0.008 | 0.008 |
|  | $SnO_2$ | 0.210 | 0.200 | 0.250 | 0.210 | 0.220 | 0.210 | 0.290 |
|  | $Fe_2O_3$ | 0.012 | 0.009 | 0.013 | 0.012 | 0.011 | 0.011 | 0.010 |
|  | $Cr_2O_3$ | 0.0001 | 0.0002 | 0.0005 | 0.0002 | 0.0001 | 0.0003 | 0.0004 |
|  | $SO_3$ | 0.0003 | 0.0002 | 0.0004 | 0.0004 | 0.0005 | 0.0002 | 0.0003 |
| β-OH (/mm) |  | 0.05 | 0.20 | 0.15 | 0.15 | 0.16 | 0.15 | 0.18 |
| Strain Point (° C.) |  | 755 | 752 | 744 | 736 | 724 | 714 | 727 |
| Thermal Shrinkage Rate (ppm) |  | 8 | 12 | 12 | 14 | 15 | 17 | 15 |
| Bubble enlarging temperature (° C.) |  | 1600 | 1610 | 1600 | 1610 | 1600 | 1580 | 1550 |
| Maximum Temperature of Fining Tank (° C.) |  | 1625 | 1650 | 1630 | 1630 | 1615 | 1600 | 1590 |
| Maximum Temperature of Fining Tank – Bubble enlarging temperature (° C.) |  | 25 | 40 | 30 | 20 | 15 | 20 | 40 |
| Bubble count (bubble/kg) |  | ○ | ◎ | ◎ | ○ | ○ | ○ | ◎ |

TABLE 3

|  | No. | 15 | 16 | 17 | 18 | 19 | 20 | 21 |
|---|---|---|---|---|---|---|---|---|
| Glass Composition (Mass %) | $SiO_2$ | 63.3 | 60.8 | 59.0 | 58.5 | 60.7 | 61.2 | 61.7 |
|  | $Al_2O_3$ | 18.8 | 18.1 | 19.3 | 19.3 | 18.4 | 17.9 | 17.4 |
|  | $B_2O_3$ | 0.7 | 1.2 | 6.5 | 4.0 | 2.7 | 2.7 | 2.7 |
|  | MgO | 3.0 | 3.0 | 2.5 | 4.8 | 1.5 | 1.5 | 1.5 |
|  | CaO | 4.3 | 4.3 | 6.3 | 5.2 | 6.2 | 6.2 | 6.2 |
|  | SrO | 2.2 | 2.2 | 0.5 | 2.0 | 3.0 | 3.0 | 3.0 |
|  | BaO | 7.5 | 8.3 | 5.7 | 6.0 | 7.3 | 7.3 | 7.3 |
|  | $P_2O_5$ | 0 | 0 | 0 | 0 | 0 | 0 | 0 |
|  | $ZrO_2$ | 0.060 | 0.050 | 0.020 | 0.030 | 0.070 | 0.040 | 0.050 |
|  | $TiO_2$ | 0.009 | 0.010 | 0.007 | 0.007 | 0.008 | 0.007 | 0.010 |
|  | $SnO_2$ | 0.300 | 0.200 | 0.200 | 0.250 | 0.210 | 0.220 | 0.200 |
|  | $Fe_2O_3$ | 0.014 | 0.013 | 0.010 | 0.013 | 0.010 | 0.012 | 0.011 |
|  | $Cr_2O_3$ | 0.0002 | 0.0004 | 0.0001 | 0.0004 | 0.0001 | 0.0003 | 0.0002 |
|  | $SO_3$ | 0.0001 | 0.0003 | 0.0003 | 0.0004 | 0.0004 | 0.0002 | 0.0002 |
| β-OH (/mm) |  | 0.11 | 0.20 | 0.30 | 0.05 | 0.15 | 0.10 | 0.12 |
| Strain Point (° C.) |  | 763 | 734 | 691 | 713 | 724 | 720 | 719 |
| Thermal Shrinkage Rate (ppm) |  | 10 | 13 | 21 | 17 | 14 | 15 | 15 |
| Bubble enlarging temperature (° C.) |  | 1625 | 1610 | 1580 | 1550 | 1580 | 1590 | 1600 |
| Maximum Temperature of Fining Tank (° C.) |  | 1650 | 1630 | 1630 | 1570 | 1610 | 1630 | 1630 |
| Maximum Temperature of Fining Tank – Bubble enlarging temperature (° C.) |  | 25 | 20 | 50 | 20 | 30 | 40 | 30 |
| Bubble count (bubble/kg) |  | ○ | ○ | ◎ | ○ | ○ | ◎ | ○ |

TABLE 4

|  | No. | 22 | 23 | 24 | 25 | 26 | 27 | 28 |
|---|---|---|---|---|---|---|---|---|
| Glass Composition (Mass %) | $SiO_2$ | 62.5 | 63.5 | 61.9 | 61.6 | 61.1 | 61.1 | 61.9 |
|  | $Al_2O_3$ | 19.5 | 18.5 | 15.8 | 18.3 | 18.6 | 18.5 | 15.8 |
|  | $B_2O_3$ | 3.5 | 2.5 | 0 | 0.7 | 0.8 | 0.8 | 0.1 |
|  | MgO | 1.0 | 1.0 | 0 | 3.4 | 3.1 | 3.4 | 0.1 |
|  | CaO | 7.0 | 7.0 | 8.7 | 3.6 | 5.2 | 3.8 | 8.7 |
|  | SrO | 2.5 | 2.5 | 1.9 | 3.2 | 0.8 | 3.2 | 1.9 |
|  | BaO | 3.8 | 4.8 | 11.4 | 9.0 | 10.4 | 9.0 | 11.4 |
|  | $P_2O_5$ | 0 | 0 | 0 | 0 | 0 | 0 | 0 |
|  | $ZrO_2$ | 0.040 | 0.060 | 0.050 | 0.004 | 0.004 | 0.005 | 0.060 |
|  | $TiO_2$ | 0.009 | 0.007 | 0.005 | 0.005 | 0.006 | 0.005 | 0.005 |
|  | $SnO_2$ | 0.200 | 0.230 | 0.210 | 0.210 | 0.220 | 0.200 | 0.200 |
|  | $Fe_2O_3$ | 0.011 | 0.012 | 0.010 | 0.010 | 0.009 | 0.010 | 0.010 |
|  | $Cr_2O_3$ | 0.0001 | 0.0003 | 0.0001 | 0.0001 | 0.0002 | 0.0001 | 0.0002 |
|  | $SO_3$ | 0.0003 | 0.0002 | 0.0004 | 0.0004 | 0.0003 | 0.0003 | 0.0003 |

TABLE 4-continued

| No. | 22 | 23 | 24 | 25 | 26 | 27 | 28 |
|---|---|---|---|---|---|---|---|
| β-OH (/mm) | 0.15 | 0.13 | 0.05 | 0.06 | 0.06 | 0.06 | 0.05 |
| Strain Point (° C.) | 734 | 742 | 749 | 751 | 749 | 748 | 749 |
| Thermal Shrinkage Rate (ppm) | 13 | 11 | 12 | 11 | 12 | 12 | 11 |
| Bubble enlarging temperature (° C.) | 1590 | 1610 | 1620 | 1615 | 1620 | 1615 | 1660 |
| Maximum Temperature of Fining Tank (° C.) | 1620 | 1650 | 1650 | 1640 | 1630 | 1630 | 1640 |
| Maximum Temperature of Fining Tank − Bubble enlarging temperature (° C.) | 30 | 40 | 30 | 25 | 10 | 15 | −20 |
| Bubble count (bubble/kg) | ○ | ◎ | ○ | ○ | ○ | ○ | X |

TABLE 5

| | No. | 29 | 30 | 31 | 32 | 33 | 34 | 35 |
|---|---|---|---|---|---|---|---|---|
| Glass Composition (Mass %) | $SiO_2$ | 64.1 | 59.8 | 61.0 | 61.0 | 59.9 | 61.0 | 59.8 |
| | $Al_2O_3$ | 16.8 | 20.0 | 20.1 | 18.7 | 18.6 | 19.4 | 20.8 |
| | $B_2O_3$ | 0.3 | 0 | 0 | 0 | 0 | 0 | 0 |
| | MgO | 1.8 | 2.0 | 2 | 2.0 | 2.1 | 1.9 | 1.9 |
| | CaO | 5.9 | 3.9 | 3.7 | 4.0 | 4.2 | 3.8 | 3.8 |
| | SrO | 0.8 | 0 | 0 | 0 | 0 | 0 | 0 |
| | BaO | 10.1 | 14.0 | 13.1 | 14.1 | 14.9 | 13.6 | 13.5 |
| | $P_2O_5$ | 0 | 0 | 0 | 0 | 0 | 0 | 0 |
| | $ZrO_2$ | 0.050 | 0.030 | 0.040 | 0.040 | 0.040 | 0.030 | 0.050 |
| | $TiO_2$ | 0.005 | 0.004 | 0.006 | 0.005 | 0.005 | 0.007 | 0.005 |
| | $SnO_2$ | 0.220 | 0.212 | 0.213 | 0.213 | 0.212 | 0.213 | 0.212 |
| | $Fe_2O_3$ | 0.012 | 0.010 | 0.010 | 0.010 | 0.011 | 0.012 | 0.012 |
| | $Cr_2O_3$ | 0.0001 | 0.0002 | 0.0003 | 0.0002 | 0.0003 | 0.0003 | 0.0001 |
| | $SO_3$ | 0.0003 | 0.0002 | 0.0003 | 0.0004 | 0.0003 | 0.0002 | 0.0003 |
| β-OH (/mm) | | 0.06 | 0.05 | 0.06 | 0.06 | 0.06 | 0.06 | 0.05 |
| Strain Point (° C.) | | 756 | 777 | 782 | 772 | 765 | 776 | 779 |
| Thermal Shrinkage Rate (ppm) | | 8 | 7 | 7 | 7 | 8 | 7 | 7 |
| Bubble enlarging temperature (° C.) | | 1640 | 1630 | 1650 | 1660 | 1630 | 1640 | 1630 |
| Maximum Temperature of Fining Tank (° C.) | | 1650 | 1650 | 1680 | 1680 | 1670 | 1680 | 1680 |
| Maximum Temperature of Fining Tank − Bubble enlarging temperature (° C.) | | 10 | 20 | 30 | 20 | 40 | 40 | 50 |
| Bubble count (bubble/kg) | | ○ | ○ | ○ | ○ | ○ | ○ | ○ |

TABLE 6

| | No. | 36 | 37 | 38 | 39 | 40 | 41 | 42 |
|---|---|---|---|---|---|---|---|---|
| Glass Composition (Mass %) | $SiO_2$ | 61.1 | 61.1 | 61.1 | 61.1 | 61.1 | 61.1 | 61.1 |
| | $Al_2O_3$ | 18.6 | 18.6 | 18.6 | 18.6 | 18.6 | 18.6 | 18.6 |
| | $B_2O_3$ | 0.7 | 0.7 | 0.7 | 0.7 | 0.7 | 0.7 | 0.7 |
| | MgO | 3.2 | 3.2 | 3.2 | 3.2 | 3.2 | 3.2 | 3.2 |
| | CaO | 5.1 | 5.1 | 5.1 | 5.1 | 5.1 | 5.1 | 5.1 |
| | SrO | 0.6 | 0.6 | 0.6 | 0.6 | 0.6 | 0.6 | 0.6 |
| | BaO | 10.4 | 10.4 | 10.4 | 10.4 | 10.4 | 10.4 | 10.4 |
| | $P_2O_5$ | 0 | 0 | 0 | 0 | 0 | 0 | 0 |
| | $ZrO_2$ | 0.020 | 0.020 | 0.020 | 0.020 | 0.020 | 0.020 | 0.020 |
| | $TiO_2$ | 0.100 | 0.100 | 0.100 | 0.100 | 0.100 | 0.100 | 0.100 |
| | $SnO_2$ | 0.190 | 0.190 | 0.190 | 0.190 | 0.190 | 0.190 | 0.190 |
| | $Fe_2O_3$ | 0.010 | 0.010 | 0.010 | 0.010 | 0.010 | 0.010 | 0.010 |
| | $Cr_2O_3$ | 0.0001 | 0.0001 | 0.0001 | 0.0001 | 0.0001 | 0.0001 | 0.0001 |
| | $SO_3$ | 0.0003 | 0.0003 | 0.0003 | 0.0003 | 0.0003 | 0.0003 | 0.0003 |
| β-OH (/mm) | | 0.06 | 0.06 | 0.06 | 0.06 | 0.06 | 0.06 | 0.06 |
| Strain Point (° C.) | | 750 | 750 | 750 | 750 | 750 | 750 | 750 |
| Thermal Shrinkage Rate (ppm) | | 10 | 10 | 10 | 10 | 11 | 11 | 11 |
| Bubble enlarging temperature (° C.) | | 1610 | 1610 | 1590 | 1590 | 1645 | 1645 | 1645 |
| Maximum Temperature of Fining Tank (° C.) | | 1630 | 1630 | 1630 | 1630 | 1630 | 1630 | 1630 |
| Maximum Temperature of Fining Tank − Bubble enlarging temperature (° C.) | | 20 | 20 | 40 | 40 | −15 | −15 | −15 |
| Forming Flow Rate Ratio | | 1.0 | 1.2 | 1.0 | 1.2 | 0.8 | 1.0 | 1.2 |
| Bubble count (bubble/kg) | | ○ | Δ | ◎ | ◎ | X | X | X |

First, silica sand, aluminum oxide, boric anhydride, calcium carbonate, strontium nitrate, barium carbonate, aluminum metaphosphate, tin oxide, strontium chloride, and barium chloride were mixed and prepared to obtain composition of Tables 1 to 6. Glass cullet β-OH value 0.1/mm, 35% by mass with respect to a total amount of the raw material batch) having the same composition as the target composition was further used for No. 1 to 7.

The glass raw material was then supplied to an electric melting furnace which does not use burner combustion in combination and melted. Subsequently, the molten glass is fined, homogenized and adjusted to the viscosity suitable for forming in the fining tank and the adjusting tank. The bubble enlarging temperature was adjusted by adjusting the temperature in the vicinity of the bottom surface of the melting furnace. The maximum temperature in the fining tank is the highest temperature among the processes. The maximum temperature in the fining tank was set to temperatures shown in each table. The maximum temperature in the fining tank was confirmed by monitoring a temperature of the platinum or platinum alloy attached to the inner wall of the fining tank.

Subsequently, the molten glass was supplied to the overflow downdraw forming device, formed into a sheet shape, and then cut to obtain a glass sample having a thickness of 0.5 mm. The molten glass exiting the melting furnace was supplied to the forming device while being in contact only with the platinum or platinum alloy.

The β-OH value, the strain point, the thermal shrinkage rate, the bubble enlarging temperature and the bubble count of the obtained glass sample were evaluated. Results thereof are shown in Tables 1 to 6.

As is apparent from Tables 1 to 6, low bubble count was obtained when the bubble enlarging temperature is lower than the maximum fining temperature.

From Table 6, it was found that low bubble count was obtained when a difference between the bubble enlarging temperature and the maximum fining temperature was sufficiently large, even when flow rates were changed. On the other hand, when the bubble enlarging temperature exceeds the maximum fining temperature, the bubble count was poor regardless of the flow rate.

The β-OH value of the glass was obtained by measuring transmittance of the glass using FT-IR and using the following formula.

$$\beta\text{-OH value} = (1/X)\log 10(T_1/T_2)$$

X: glass thickness (mm)
T1: transmittance (%) at the reference wavelength of 3846 $cm^{-1}$
T2: minimum transmittance (%) around the hydroxyl absorption wavelength of 3600 $cm^{-1}$ The strain point was measured based on a method of ASTM C336-71.

Figure 3:
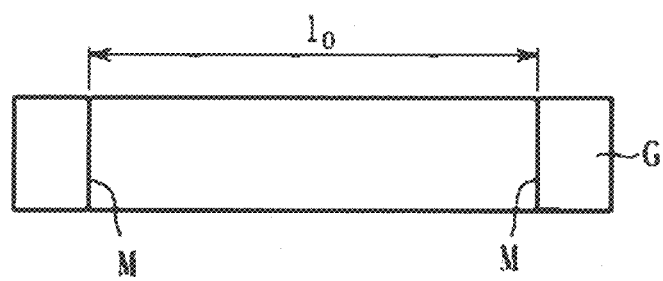
FIG. 3 is a plane diagram which shows a procedure of measuring a thermal shrinkage rate of a glass substrate.
Figure 3:
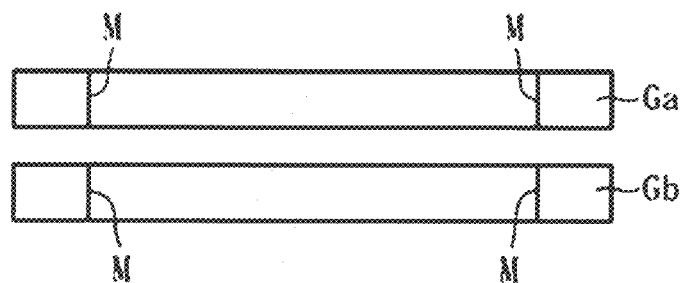
Figure 3:
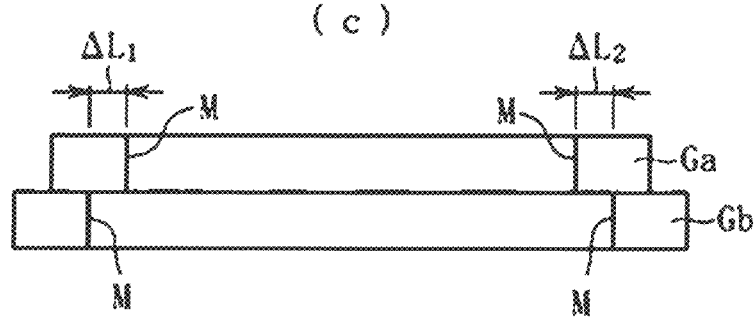

The thermal shrinkage rate was measured by the following method. First, as shown in FIG. 3(a), a strip sample G of 160 mm×30 mm was prepared as a sample of the glass substrate. Markings M are formed by using #1000 waterproof abrasive papers at two end portions in a long side direction of the strip sample G at positions which are 20 mm to 40 mm away from end edges. Thereafter, as shown in FIG. 3(b), the strip sample G on which the markings M were formed was folded into two along a direction orthogonal to the markings M so as to prepare sample pieces Ga and Gb. Then, only one sample piece Gb was subjected to heat processing in which the one sample piece Gb was heated from room temperature (25° C.) to 500° C. at 5° C./min, held at 500° C. for 1 hour, and then cooled to the room temperature at 5° C./min. After the heat processing, as shown in FIG. 3(c), in a state where the sample piece Ga which was not subjected to the heat processing and the sample piece Gb which was subjected to the heat processing are arranged in parallel, positional deviation amounts (ΔL1, ΔL2) of the markings M of the two sample pieces Ga and Gb are read by a laser microscope, and the thermal shrinkage rate is calculated by the following formula. It should be noted that $I_0$ in the formula is a distance between the initial markings M.

$$\text{Thermal Shrinkage Rate} = [\{\Delta L_1(\mu m) + \Delta L_2(\mu m)\} \times 10^3]/I_0(mm) \text{ (ppm)}$$

The bubble enlarging temperature was obtained as follows. First, the obtained glass board was crushed and classified to 2.0 to 5.6 mm. 15 g of the classified glass was placed in a quartz tube and held at 1500° C. for 10 minutes. Thereafter, the temperature was raised from 1500° C. to 1650° C. at a heating rate of 2° C./min, and behavior of bubbles in the glass melt was imaged by a video camera. Three or more bubbles having a diameter of 100 μm or less were randomly selected by using an imaged moving image or an observation image extracted from the moving image, and bubble diameters thereof were measured at every 10° C. Based on a result of the observation, a temperature at which an expansion length of the bubble diameter became equal to or larger than 50 μm was taken as the bubble enlarging temperature.

The number of bubbles having a diameter of 100 μm or more was counted, and when the number was 0.05 or less bubble/kg, the bubble count is denoted by "⊚", when the number was 0.05 to 0.1 bubble/kg, the bubble count is denoted by "○", when the number was 0.1 to 0.3 bubble/kg, the bubble count is denoted by "△", and when the number was more than 0.3 bubble/kg, the bubble count is denoted by "×".

A forming flow rate refers to a flow rate of the molten glass that enters the forming device 4 from the flow path 7 in FIG. 2. A forming flow rate ratio in Table 6 indicates a ratio of "a forming flow rate of No. X/the forming flow rate of No. 1" based on Example No. 1.

Although the present invention has been described in detail with reference to specific examples, it is apparent to those skilled in the art that it is possible to add various alterations and modifications without departing from the spirit and the scope of the present invention.

The present application is based on a Japanese patent application filed on Sep. 5, 2017 (JP-A-2017-170227; priority date: Sep. 5, 2017), a Japanese patent application filed on Oct. 10, 2017 (JP-A-2017-196722; priority date: Oct. 10, 2017) and an international patent application filed on Aug. 2, 2018 (PCT/JP2018/029122; priority date: Aug. 2, 2018), the content of which is incorporated by references. All references cited herein are entirely incorporated.

INDUSTRIAL APPLICABILITY

According to the present invention, it is possible to easily obtain a glass substrate having low bubble count and low thermal shrinkage rate which is suitable for manufacturing a low-temperature polysilicon TFT thereon.

REFERENCE SIGNS LIST

1 Melting furnace
2 Fining tank
3 Adjusting tank

4 Forming device
5, 6, 7 Connection flow path
10 Glass manufacturing device

The invention claimed is:

1. A method for manufacturing an alkali-free glass substrate, comprising:
a batch preparing process of preparing a raw material batch so as to obtain alkali-free glass having a strain point of 700° C. or more;
a melting process of melting the prepared raw material batch in a melting furnace;
a fining process of fining the molten glass; and
a forming process of forming the fined glass into a sheet shape, wherein the raw material batch is melted such that a bubble enlarging temperature of the obtained glass is lower than a maximum temperature of the fining process,
wherein during the melting process electricity is supplied to the prepared raw material batch by applying electricity between a plurality of electrodes arranged on a bottom wall of the melting furnace and the prepared raw material batch is melted by Joule heat thereof, and
the alkali-free glass contains, in mass %, 50 to 80% of $SiO_2$, 15 to 30% of $Al_2O_3$, 0 to 4.5% of $B_2O_3$, 0 to 10% of MgO, 0 to 8% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition.

2. The method for manufacturing an alkali-free glass substrate according to claim 1, further comprising an evaluation process of evaluating bubble count of the obtained glass, wherein the bubble enlarging temperature is adjusted based on the bubble count of the obtained glass.

3. The method for manufacturing an alkali-free glass substrate according to claim 1, wherein the raw material batch is melted such that the bubble enlarging temperature of the obtained glass is 1550 to 1680° C.

4. The method for manufacturing an alkali-free glass substrate according to claim 1, wherein radiation heating by burner combustion is not used in combination in the melting process.

5. The method for manufacturing an alkali-free glass substrate according to claim 1, wherein a chloride is added to the raw material batch.

6. The method for manufacturing an alkali-free glass substrate according to claim 1, wherein a raw material serving as a boron source is not added to the raw material batch.

7. The method for manufacturing an alkali-free glass substrate according to claim 1, wherein a boric anhydride is used in at least a part of a glass raw material serving as a boron source.

8. The method for manufacturing an alkali-free glass substrate according to claim 1, wherein the raw material batch does not contain a hydroxide raw material.

9. The method for manufacturing an alkali-free glass substrate according to claim 1, wherein a glass cullet is added to the raw material batch, and the glass cullet includes, as at least a part thereof, a glass cullet made of glass having a β-OH value of 0.4/mm or less.

10. The method for manufacturing an alkali-free glass substrate according to claim 1, wherein the glass raw material and/or the melting process are adjusted such that the obtained glass has a β-OH value of 0.2/mm or less.

11. The method for manufacturing an alkali-free glass substrate according to claim 1, wherein the obtained glass has a strain point higher than 700° C.

12. The method for manufacturing an alkali-free glass substrate according to claim 1, wherein the obtained glass has a thermal shrinkage rate of 20 ppm or less.

13. The method for manufacturing an alkali-free glass substrate according to claim 1, wherein the alkali-free glass contains, in mass %, 50 to 80% of $SiO_2$, 15 to 30% of $Al_2O_3$, 0 to 4.5% of $B_2O_3$, 0 to 10% of MgO, 2.5 to 8% of CaO, 0 to 10% of SrO, 0 to 15% of BaO, 0 to 5% of ZnO, 0 to 5% of $ZrO_2$, 0 to 5% of $TiO_2$, 0 to 15% of $P_2O_5$ and 0 to 0.5% of $SnO_2$ as a glass composition.

\* \* \* \* \*